United States Patent
Hamada et al.

(10) Patent No.: US 8,075,795 B2
(45) Date of Patent: Dec. 13, 2011

(54) PIEZOELECTRICS, PIEZOELECTRIC ELEMENT, AND PIEZOELECTRIC ACTUATOR

(75) Inventors: Yasuaki Hamada, Suwa (JP); Akio Konishi, Shiojiri (JP); Takeshi Kijima, Saitama (JP)

(73) Assignee: Seiko Epson Corporation (JP)

( * ) Notice: Subject to any disclaimer, the term of this patent is extended or adjusted under 35 U.S.C. 154(b) by 455 days.

(21) Appl. No.: 12/402,828

(22) Filed: Mar. 12, 2009

(65) Prior Publication Data

US 2009/0230346 A1    Sep. 17, 2009

(30) Foreign Application Priority Data

Mar. 14, 2008 (JP) ................ 2008-065771

(51) Int. Cl.
*C04B 35/49* (2006.01)
*B41J 2/00* (2006.01)
*C01G 33/00* (2006.01)

(52) U.S. Cl. .............. 252/62.9 PZ; 501/134; 310/311
(58) Field of Classification Search ............ 310/311; 252/62.9 PZ; 501/134
See application file for complete search history.

(56) References Cited

U.S. PATENT DOCUMENTS 7,196,457 B2   3/2007 Miyazawa et al.
2005/0236652 A1* 10/2005 Kijima et al. .......... 257/213
2006/0216549 A1*  9/2006 Kijima et al. .......... 428/701

FOREIGN PATENT DOCUMENTS

| JP | 2005-100660 | 4/2005 |
|----|-------------|--------|
| JP | 2005-150694 | 6/2005 |
| JP | 2005-159309 | 6/2005 |
| JP | 2005-353756 | 12/2005 |
| JP | 2006-120513 | 5/2006 |
| JP | 2006-270554 | 10/2006 |

OTHER PUBLICATIONS

Haccart, T. et al., Piezoelectric Properties of PZT: Influence of (Zr/Ti) Ratio and Niobium Substitution, Ferroelectrics, Taylor & Francis; Philadelphia, Pa., Ferroelectrics, 2001, vol. 254, pp. 185-195.
Dvorsek, M. et al., "Microstructural and Electromechanical Properties of Donor Doped PZT Ceramics", Science of Ceramics, Swedish Institute for Silicate Research, Gothenburg, 1988, vol. 14, pp. 951-956.

* cited by examiner

Primary Examiner — Carol M Koslow
(74) Attorney, Agent, or Firm — Harness, Dickey & Pierce, P.L.C.

(57) ABSTRACT

A piezoelectric body includes a perovskite type compound that is expressed by a compositional formula being $Pb(Zr_x Ti_{1-x})_{1-y} M_y O_3$, where M is at least one of Ta and Nb, x is in a range of $0.51 \leq x \leq 0.57$, and y is in a range of $0.05 \leq y < 0.2$, wherein the perovskite type compound contains at least one of $SiO_2$ and $GeO_2$ as an additive, and the additive is added in an amount of 0.5 mol % or higher but 5 mol % or lower with respect to the amount of perovskite type compound.

3 Claims, 5 Drawing Sheets

PIEZOELECTRICS, PIEZOELECTRIC ELEMENT, AND PIEZOELECTRIC ACTUATOR

This application claims a priority to Japanese Patent Application No. 2008-065771 filed on Mar. 14, 2008 which is hereby expressly incorporated by reference herein in its entirety.

BACKGROUND

1. Technical Field

The present invention relates to piezoelectrics, and piezoelectric elements and piezoelectric actuators using the piezoelectrics.

2. Related Art

Piezoelectric elements are used in a variety of applications, such as, piezoelectric actuators, pressure sensors, ultrasonic devices, liquid ejection heads, ink jet printers and the like. Piezoelectric elements generally have a structure in which a piezoelectric layer formed from piezoelectrics is sandwiched between electrodes. As the piezoelectrics to be used, $Pb(Zr, Ti)O_3$ (lead zirconate titanate: PZT) may be typically used.

In an attempt to improve various piezoelectric characteristics of such piezoelectrics, for example, piezoelectrics in which at least a part of Zr and Ti at the B site (to be described below) of PZT is replaced with Nb have been proposed, as described in, for example, Japanese Laid-open Patent Application JP-A-2005-100660. Such piezoelectrics exhibits higher reliability when formed into piezoelectric elements, compared to PZT.

Perovskite type compounds are compounds whose compositional formula is generally expressed by $ABX_3$. Perovskite type compounds, when expressed by such formula, have a structure in which, when crystallized, a positive ion at the position of A element (hereafter referred to as the A site) bonds with 12 negative ions X as ligands, and a positive ion at the position of B element (hereafter referred to as the B site) bonds with 6 negative ions X as ligands. Such crystal structure is called a perovskite structure. Perovskite type compounds can assume a perovskite structure when crystallized, such that a variety of characteristics, such as, for example, ferroelectricity, pyroelectricity and piezoelectricity can be exhibited.

If perovskite type compounds are formed merely to have a perovskite structure to exhibit only piezoelectricity, the elements may be selected in a relatively wide range of composition ratios. For example, PZT can have a perovskite structure at an arbitrary ratio of Zr and Ti. However, the composition ratio of perovskite type compounds is limited to a very narrow range when they are to be used as piezoelectric elements. PZT is known to have the morphotropic phase boundary (MPB) between rhombohedra and tetragonal phase crystals having perovskite structure near a ratio of Zr/Ti=53:47 in mole ratio. It is known that the piezoelectric constant and the electromechanical coupling coefficient are generally higher in the vicinity of the MPB compositions in perovskite type compounds than in other composition areas, and PZT with compositions in the vicinity of the MPB are mainly used in piezoelectric elements formed from PZT. It is therefore important to control sufficiently the range of compositions of piezoelectric materials when they are to be used for piezoelectric elements.

Due to the reasons described above, in piezoelectrics in which Nb or the like is introduced in the B site to improve the reliability, the compositions of the MPB have not been necessarily clearly understood, and the piezoelectric characteristics would occasionally change when the compositions are changed. In piezoelectrics in which at least a portion of Zr and Ti at the B site in PZT is replaced with Nb, such composition-dependence of the piezoelectric characteristic is not sufficiently understood, and in particular, morphotropic phase boundary (MPB) compositions that are assumed to provide the most excellent piezoelectric characteristics have not been clearly found.

SUMMARY

The inventors named in the present application have discovered that, when other elements are replaced at the B site of PZT, it is possible to obtain piezoelectrics with more excellent piezoelectric performance by precisely controlling each of the compositions.

In accordance with an advantage of some aspects of the invention, it is possible to provide piezoelectrics of lead titanate zirconate system having compositions with excellent piezoelectric characteristics.

In accordance with another advantage of some aspects of the invention, it is possible to provide piezoelectric elements and piezoelectric actuators, which use piezoelectrics of lead titanate zirconate system having excellent piezoelectric characteristics.

A piezoelectric body in accordance with an embodiment of the invention includes a perovskite type compound that is expressed by a compositional formula of $Pb(Zr_xTi_{1-x})_{1-y}M_yO_3$, where M is at least one of Ta and Nb and replaces at least one of Zr and Ti, x is in a range of $0.51 \leqq x \leqq 0.57$, and y is in a range of $0.05 \leqq y < 0.2$, wherein the perovskite type compound contains at least one of $SiO_2$ and $GeO_2$ as an additive, and the additive is added in an amount of 0.5 mole % or higher but 5 mole % or lower with respect to the amount of perovskite type compound.

The piezoelectric body described above is a piezoelectric body of lead titanate zirconate system, and includes compositions with excellent piezoelectric characteristics, in particular, excellent piezoelectric constant $d_{33}$.

A piezoelectric element in accordance with an embodiment of the invention includes the piezoelectric body described above.

The piezoelectric element described above has excellent piezoelectric characteristics.

A piezoelectric actuator in accordance with an embodiment of the invention has the piezoelectric element described above.

The piezoelectric actuator has excellent piezoelectric characteristics.

DESCRIPTION OF EXEMPLARY EMBODIMENTS

Preferred embodiments of the present invention are described below with reference to the accompanying drawings. It is noted that the embodiments shall be described as examples of the invention.

1. Piezoelectrics
1.1. Piezoelectrics

Figure 1:
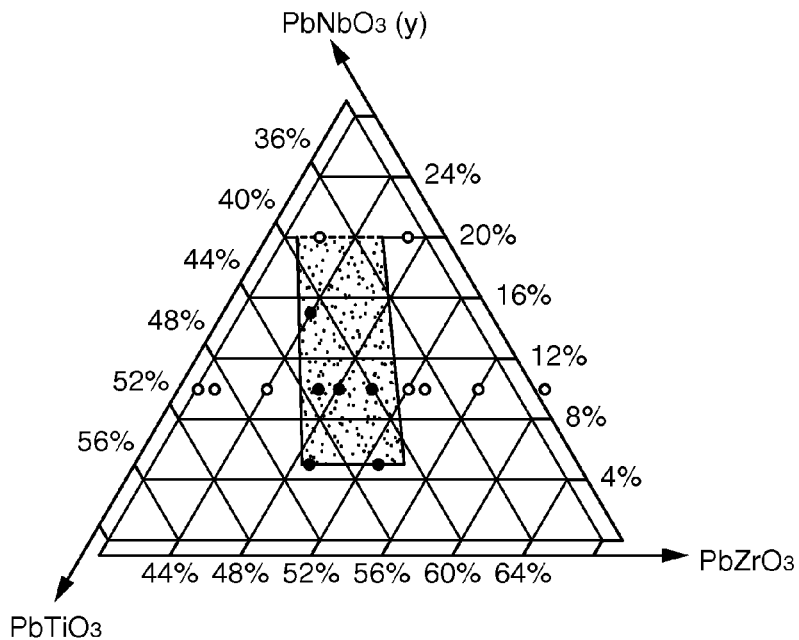
FIG. 1 schematically shows the state of composition ratios of piezoelectrics in accordance with an embodiment of the invention.

FIG. 1 schematically shows the state of composition ratios of lead titanate-lead zirconate-lead niobate piezoelectrics in accordance with an embodiment of the invention.

Piezoelectrics in accordance with the present embodiment include perovskite type compounds.

Perovskite type compounds in accordance with the present embodiment are expressed by $ABX_3$, where X is oxygen (O). More concretely, perovskite type compounds in accordance with the present embodiment may be expressed by a compositional formula of $Pb(Zr_x Ti_{1-x})_{1-y} M_y O_3$ (Compositional Formula 1). The A site of the perovskite type compounds in accordance with the present embodiment is occupied by lead (Pb), and the B site is mainly occupied by zirconium (Zr) and titanium (Ti). Further, in part of the B site, at least one of Zr and Ti is replaced with at least one of tantalum (Ta) and niobate (Nb). The replacement rate is indicated by y in the compositional formula (1). On the other hand, the ratio of Zr and Ti may be expressed by $Zr:Ti=x:(1-x)$, using x and (1-x) in the compositional formula (1).

In the perovskite type compounds in accordance with the present embodiment, x is in the range of $0.51 \leq x \leq 0.57$, and y is in the range of $0.05 \leq y < 0.2$. When x becomes smaller than 0.51, the perovskite type compounds stay outside the morphotropic phase boundary (MPB) compositions at any values of y in the range, and the value of piezoelectric constant $d_{33}$ becomes small, which are not desirable. When x becomes greater than 0.57, the value of piezoelectric constant $d_{33}$ becomes small, which is also not desirable. When y becomes smaller than 0.05, the amount of Nb contained becomes insufficient, and the reliability (long-term performance) of the piezoelectric material becomes lowered, which are not desirable. When y becomes 0.2 or greater, the pyrochroa crystal structure that does not exhibit piezoelectricity is generated when the perovskite type compounds crystallize, and the crystal orientation becomes poor when the material is used for piezoelectric elements, which are not desirable.

A hatched region in FIG. 1 indicates the range of compositions of perovskite type compounds in accordance with an embodiment of the invention. FIG. 1 shows an example of perovskite type compounds in accordance with the present embodiment in which at least one of Zi and Ti at the B site is replaced with Nb. An axis of $PbNbO_3$ in FIG. 1 directly corresponds to y described above. Values of x in FIG. 1 may be obtained, using the content of $PbZrO_3$ (which may hereafter be referred to as [Zr]) in the perovskite type compound and the content of $PbTiO_3$ (which may hereafter be referred to as [Ti]) in the perovskite type compound, by calculating $[Zr]/([Zr]+[Ti])$.

Perovskite type compounds can generate crystals having the perovskite structure by an appropriate operation such as sintering. Because the size of atoms of Nb or Ta in the perovskite structure is similar to that of Zr or Ti (ionic radii are close to each other and atomic radii are identical), it is hard for atoms to slip out the lattice even by collision among atoms by lattice vibration. Further, its valence is +5, which is stable. Therefore, even when Pb slips out of the lattice, the valence resulting from the vacated Pb can be supplemented by $Nb^{5+}$ or $Ta^{5+}$. Also, even if a Pb vacancy occurs at the time of crystallization, it is easier for Nb or Ta having a smaller size to enter than O having a larger size to slip out.

Furthermore, Nb or Ta may also have a valence of +4, such that it can sufficiently function as a substitute for $Zr^{4+}$ or $Ti^{4+}$. Moreover, Nb or Ta has in effect a very strong covalent bond, and it is believed that Pb is also difficult to slip out when Zr or Ti is replaced with Nb or Ta (see, for example, H. Miyazawa, E. Natori, S. Miyashita; Jpn. J. Appl. Phys. 39 (2000) 5679).

Also, in the similar thought, in order to prevent Pb from slipping out the lattice in the perovskite type compounds in accordance with the present embodiment, Pb may be replaced with elements with a valence of +3 or greater. As elements with a valence of +3 or greater, elements of the lanthanoid systems, such as, La, Ce, Pr, Nd, Pm, Sm, Eu, Gd, Tb, Dy, Ho, Er, Tm, Yb, and Lu are enumerated as candidate elements other than Nb and Ta described above. Moreover, W, V, Mo, and Mn may be enumerated as elements that can provide similar effects.

Until now, the Nb doping in PZT has been mainly performed into Zr-rich rhombohedral crystal regions and is extremely small, on the order of 0.2 mol % to 0.025 mol % (see, for example, J. Am. Ceram. Soc, 84 (2001) 902 and Phys. Rev. Let, 83 (1999) 1347). The main reason why it has not been possible to dope a large amount of Nb is considered to be because the addition of 10 mol % of Nb, for example, would cause the crystallization temperature to elevate to 800° C. or higher.

Therefore, the perovskite type compounds in accordance with the present embodiment further include at least one of silicon oxide ($SiO_2$) and germanium oxide ($GeO_2$) as an additive. The amount of at least one of $SiO_2$ and $GeO_2$ as an additive may be 0.5 mol % or higher but 5 mol % or lower, with respect to the amount of perovskite type compound. This makes it possible to reduce the crystallization energy of the perovskite type compounds in accordance with the present embodiment. In other words, the crystallization temperature of the perovskite type compounds in accordance with the present embodiment can be lowered.

It can also be said that the perovskite type compounds in accordance with the present embodiment may be lead titanate zirconate (PZT) in which at least one of Nb and Ta is doped at the B site thereof.

The piezoelectrics in accordance with the present embodiment may further include other compositions in addition to the perovskite type compounds described above. As the substances that can be included in the piezoelectrics in accordance with the embodiment, for example, piezoelectrics such as PZT, and complex oxides, such as, $SrBi_2Ta_2O_9$ (SBT), $(Bi,La)_4Ti_3O_{12}$ (BLT) and the like having the perovskite type crystal structure can be used. By the inclusion of such other compositions, piezoelectric characteristics of the piezoelectric material can be changed.

1.2. Method for Manufacturing Piezoelectric Body

Figure 2:
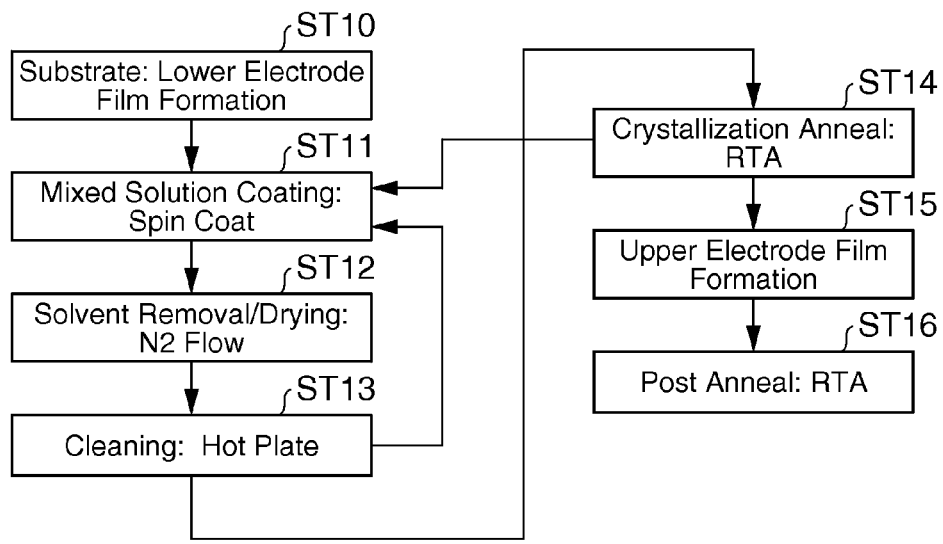
FIG. 2 is a flow chart showing an example of a method for manufacturing a piezoelectric body in accordance with an embodiment of the invention.

A piezoelectric body in accordance with the present embodiment may be manufactured by a sol-gel method, a MOD (metallo-organic decomposition) method, a CVD (chemical vapor deposition) method, a sputter method, or a laser ablation method. Among the manufacturing methods listed above, a method for manufacturing a piezoelectric body in accordance with an embodiment of the invention using a sol-gel method is described below as an example. The example below is described as to the case where M in the compositional formula (1) is Nb shall be described. Also, in the example described below, at least one of $SiO_2$ and $GeO_2$, more specifically, $SiO_2$ is included as an additive. FIG. 2 is a flow chart showing an example of a method for manufacturing a piezoelectric body in accordance with an embodiment of the invention.

First, a first source material solution, a second source material solution and a third source material solution containing at least one of Pb, Zr and Ti, respectively, are prepared (to be described below). Further, a solution for introducing an additive being $SiO_2$ is prepared. In order to improve the dispersability of the solution, a solvent such as n-buthanol may be further added to the mixed solution described above by 1 mol % or higher but less than 5 mol %. As compounds included in the solution to introduce $SiO_2$, tetraalkoxysilane, such as, $Si(OCH_3)_4$, $Si(OC_2H_5)_4$, $Si(OCH_2 CH_2 CH_3)_4$, $Si[OCH(CH_3)_2]_4$, $Si(OCH_2CH_2CH_2CH_3)_4$, $Si[OCH(CH_3)CH_2CH_3]_4$, $Si[OCH_2(CH_3)_2]_4$, $Si[OC(CH_3)_3]_4$, $Si(OCH_3)_3(OC_2H_5)$, $Si(OCH_3)_2(OC_2H_5)_2$, $Si(OCH_3)(OC_2H_5)(OC_3H_7)_2$, $Si(OCH_3)(OC_2H_5)(OC_3H_7)(OC(CH_3)HCH_3)$, $Si(OCH_3)(OC_4H_9)_3$, and the like may be enumerated.

As the first source material liquid, a solution in which a condensation polymerization monomer for forming a perovskite crystal structure ($PbZrO_3$) with Pb and Zr among the constituent metal elements of the perovskite type compounds is dissolved in a solvent such as n-buthanol in an anhydrous state may be exemplified. As the condensation polymerization monomer for forming the perovskite crystal structure ($PbZrO_3$), lead acetate, and zirconium tetra-alkoxide, such as, $Zr(OCH_3)_4$, $Zr(OC_2H_5)_4$, $Zr(OCH_2 CH_2 CH_3)_4$, $Zr[OCH(CH_3)_2]_4$, $Zr(OCH_2CH_2CH_2CH_3)_4$, $Zr[OCH(CH_3)CH_2CH_3]_4$, $Zr[OCH_2(CH_3)_2]_4$, $Zr[OC(CH_3)_3]_4$, $Zr(OCH_3)_3(OC_2H_5)$, $Zr(OCH_3)_2(OC_2H_5)_2$, $Zr(OCH_3)(OC_2H_5)(OC_3H_7)_2$, $Zr(OCH_3)(OC_2H_5)(OC_3H_7)(OC(CH_3)HCH_3)$, $Zr(OCH_3)(OC_4H_9)_3$, and the like may be enumerated.

As the second source material liquid, a solution in which a condensation polymerization monomer for forming a perovskite crystal structure ($PbTiO_3$) with Pb and Ti among the constituent metal elements of the perovskite type compounds is dissolved in a solvent such as n-buthanol in an anhydrous state may be exemplified. As the condensation polymerization monomer for forming $PbTiO_3$, lead acetate, and titanium tetra-alkoxide, such as, $Ti(OCH_3)_4$, $Ti(OC_2H_5)_4$, $Ti(OCH_2 CH_2 CH_3)_4$, $Ti[OCH(CH_3)_2]_4$, $Ti(OCH_2CH_2CH_2CH_3)_4$, $Ti[OCH(CH_3)CH_2CH_3]_4$, $Ti[OCH_2(CH_3)_2]_4$, $Ti[OC(CH_3)_3]_4$, $Ti(OCH_3)_3(OC_2H_5)$, $Ti(OCH_3)_2(OC_2H_5)_2$, $Ti(OCH_3)(OC_2H_5)(OC_3H_7)_2$, $Ti(OCH_3)(OC_2H_5)(OCH_2CH_2CH_3)(OC(CH_3)HCH_3)$, $Ti(OCH_3)(OC_4H_9)_3$, and the like may be enumerated.

As the third source material liquid, a solution in which a condensation polymerization monomer for forming a perovskite crystal structure ($PbNbO_3$) with Pb and Nb among the constituent metal elements of the perovskite type compounds is dissolved in a solvent such as n-buthanol in an anhydrous state may be exemplified. As the condensation polymerization monomer for forming $PbNbO_3$, lead acetate, and niobate tetra-alkoxide, such as, $Nb(OCH_3)_4$, $Nb(OC_2H_5)_4$, $Nb(OCH_2 CH_2 CH_3)_4$, $Nb[OCH(CH_3)_2]_4$, $Nb(OCH_2CH_2CH_2CH_3)_4$, $Nb[OCH(CH_3)CH_2CH_3]_4$, $Nb[OCH_2(CH_3)_2]_4$, $Nb[OC(CH_3)_3]_4$, $Nb(OCH_3)_3(OC_2H_5)$, $Nb(OCH_3)_2(OC_2H_5)_2$, $Nb(OCH_3)(OC_2H_5)(OC_3H_7)_2$, $Nb(OCH_3)(OC_2H_5)(OCH_2CH_2CH_3)(OC(CH_3(HCH_3))$, $Nb(OCH_3)(OC_4H_9)_3$, and the like may be enumerated.

The first through third source material solutions and the additive solution described above are mixed to form a mixed solution, and the mixed solution is crystallized by heat treatment, whereby a piezoelectric body in accordance with the present embodiment can be obtained.

The procedure of the sol-gel method may be conducted according to a known procedure. More concretely, the following method may be exemplified. First, the first through third source material solutions described above are mixed, while taking into consideration of ingredients that may be evaporated and dissipated by sintering. For example, when a perovskite type compound composed of Pb $Zr_{0.477}$ $Ti_{0.423}$ $Nb_{0.1}O_3$ (when y=0.1, and x=0.53 in compositional formula (1)) is to be obtained, the first through third source material solutions are mixed, for example, in a mixing ratio ((the first source material solution):(the second source material solution):(the third source material solution)) of 47.7:42.3:10. Furthermore, this mixed solution is further mixed with, for example, a tetramethoxysilane solution, to prepare the sol-gel solution.

Next, the sol-gel solution is crystallized. More concretely, the piezoelectric body in accordance with the present embodiment is obtained according to a flow chart shown in FIG. 2. As shown in FIG. 2, a series of steps consisting of a sol-gel solution coating step (step ST11), an alcohol removal step, a dry thermal treatment step, and a cleaning thermal treatment step (step ST12, step ST13) is conducted a desired number of times, and then a sintering step (step ST14) is conducted for crystallization annealing, thereby obtaining the piezoelectric body in accordance with the present embodiment.

First, a substrate is prepared, and the sol-gel solution is coated on the substrate by a coating method, such as, spin coat method (step ST11). The substrate may be provided with precious metal films such as Pt for electrodes formed thereon (step ST10). The spin coat method is conducted by dripping the sol-gel solution on the substrate. In order to spread the dripped sol-gel solution over the entire substrate surface, the substrate may be rotated at about 500 rpm, then the rotation speed is increased to about 1,500 rpm or higher and it is rotated for about 15 seconds to 60 seconds, thereby making the film thickness uniform. Then, the dry thermal treatment step is conducted for removing unnecessary solvent and drying the film. The dry thermal treatment step may be conducted in flowing and heated nitrogen gas. The dry thermal treatment step (steps ST12-ST13) removes organic compositions in the solution. The dry thermal treatment step is conducted at 150° C. to 180° C. (step ST13), and then the cleaning step is conducted in succession in the air atmosphere using a hot-plate. The cleaning step may be conducted on a hot-plate which is held at 300° C. to 350° C., for three minutes, for example, in the air atmosphere (step ST13). The sintering step for crystallization is conducted by using rapid thermal annealing (RTA) or the like in an oxygen atmosphere (step ST14). The annealing step for crystallization may be conducted at 750° C., for example, for one minute, for example. It is noted that, in the case of the exemplified sol-gel method, the film thickness of the piezoelectric body after sintering may be about 10 nm to about 200 nm, and a piezoelectric body having a large film thickness can be obtained by repeating the steps of coating source material solution and preheating a plurality of times, and then conducting the step of annealing for crystallization. Alternatively, by repeating a series of steps of coating source material solution, preheating and annealing for crystallization a plurality of times, a piezoelectric body having a large film thickness can be obtained. A piezoelectric body obtained by the method described above may have a film thickness of about 10 nm to about 2000 nm. Then, if necessary, Pt or the like is sputtered to form a film for an upper electrode (step ST15). Then, if necessary, post-annealing may be conducted (step ST16). The post-annealing may be conducted at 750° C. for 10 minutes, for example. When an upper electrode is not formed, the temperature and the time for crystallization annealing may be changed, whereby the post-annealing step may be omitted.

It is noted that, if a sol-gel solution that does not contain an additive such as $SiO_2$ and $GeO_2$ is crystallized as is, high crystallization temperatures are needed. In other words, when Nb is mixed in a perovskite type compound, its crystallization temperature rapidly elevates, making crystallization impossible in the temperature range below 700° C. For this reason, conventionally, Nb in the amount of 5 mol % or higher has not been used as a replacement element at the B-site. This is clear from some reference documents, such as, J. Am. Ceram. Soc, 84 (2001) 902 and Phys. Rev. Let, 83 (1999) 1347. In accordance with the present embodiment, a source material for $SiO_2$ is contained in the sol-gel solution in advance, such that the crystallization can be caused in a temperature range below 700° C.

1.3. Effects

Piezoelectric bodies in accordance with the present embodiment include perovskite type compounds having the compositions in the composition ranges described above. Therefore, the piezoelectric bodies in accordance with the present embodiment would not deviate from the morphotropic phase boundary (MPB) compositions, and their piezoelectric characteristics are very favorable. Because the compositions are precisely controlled, the piezoelectric bodies in accordance with the present embodiment have a substantially higher piezoelectric constant $d_{33}$, among various piezoelectric characteristics, compared to that of piezoelectrics having other compositions. Also, according to the piezoelectric bodies in accordance with the present embodiment, pyrochroa structures would be difficult to form at the time of sintering, compared to piezoelectrics having other compositions, and the crystal orientation is excellent when sintered (which makes it easier to obtain crystals having a <111> orientation in the normal direction of the electrode, when the piezoelectric body is used for a piezoelectric element). Moreover, according to the piezoelectrics in accordance with the present embodiment, the sintering temperature can be lowered, compared to that of piezoelectrics having other compositions. The piezoelectrics in accordance with the present embodiment can favorably be used in piezoelectric elements, piezoelectric actuators, liquid jet heads, liquid jet apparatuses and the like.

2. Piezoelectric Element and Piezoelectric Actuator

Figure 3:
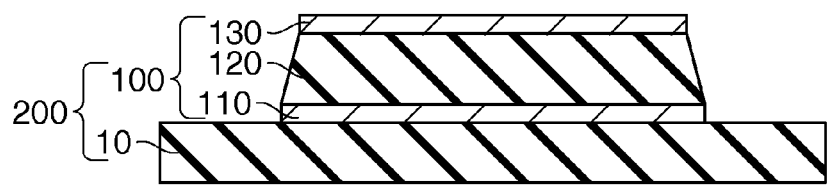
FIG. 3 is a schematic cross-sectional view of a piezoelectric element and a piezoelectric actuator in accordance with an embodiment of the invention.

FIG. 3 is a schematic cross-sectional view of a piezoelectric element 100 that is an example of a piezoelectric element in accordance with an embodiment of the invention, and a piezoelectric actuator 200 that is an example of a piezoelectric actuator in accordance with an embodiment of the invention.

The piezoelectric element 100 has a piezoelectric layer 120 composed of the piezoelectrics described above. The piezoelectric actuator 200 in accordance with the present embodiment has the piezoelectric element 100.

The piezoelectric element 100 is provided above the substrate 10, as shown in FIG. 3. The substrate 10 may be a vibration plate that includes at least one of zirconium oxide, silicon oxide and silicon nitride. Also, the substrate 10 may be formed from a silicon substrate, a GaAs substrate, a SOI (silicon on insulator) substrate, a silicon oxide substrate, a quartz substrate, or the like.

The piezoelectric element 100 is formed by laminating a lower electrode 110, a piezoelectric layer 120 and an upper electrode 130. The lower electrode 110, the piezoelectric layer 120 and the upper electrode 130 may be patterned appropriately by etching as they are formed, respectively, using a known photolithography method.

The lower electrode 110 is formed above the substrate 10. The thickness of the lower electrode 110 may be arbitrarily set within the range in which deformation of the piezoelectric layer 120 can be transmitted at least to the substrate 10. The thickness of the lower electrode 110 may be, for example, 20 nm to 400 nm. The lower electrode 110 pairs with the upper electrode 130 to sandwich the piezoelectric layer 120, and functions as one of the electrodes of the piezoelectric element 100. The lower electrode 110 may be made of any material having conductivity that satisfies the function described above, without any particular limitation. As the material for the lower electrode 110, any one of various kinds of metal, such as, nickel, iridium, platinum and the like, a conductive oxide of the forgoing metal (for example, iridium oxide and the like), a complex oxide of strontium and ruthenium, or the like. Also, the lower electrode 110 may be in a single layer composed of the material exemplified above, or may have a structure of laminated layers of plural materials.

The piezoelectric layer 130 is formed on and in contact with the lower electrode 110. The piezoelectric layer 130 may have a thickness of 300 nm to 1500 nm to secure its mechanical reliability. When an electric field is applied by the lower electrode 110 and the upper electrode 130, the piezoelectric layer 130 deforms in extension and contraction thereby functioning to deform the substrate 10. The piezoelectric layer 130 is formed from the piezoelectrics in accordance with the present embodiment.

The upper electrode 130 is formed on and in contact with the piezoelectric layer 130. The upper electrode 130 may have any thickness without any particular limitation in the range that does not negatively affect the operation of the piezoelectric element 100. The thickness of the upper electrode 130 may be, for example, 10 nm to 400 nm. The upper electrode 130 may be made of any material having conductivity that satisfies the function described above, without any particular limitation. The upper electrode 130 may be made of a material similar to that of the lower electrode 110.

The piezoelectric element 100 has the piezoelectric material described above in the piezoelectric layer 120, such that piezoelectric characteristics including the property to convert electrical energy to mechanical energy are excellent.

The piezoelectric element 100 may be manufactured, for example, as follows. First, a lower electrode 110 is formed above a substrate 10. The lower electrode 110 may be formed through forming a film by a vapor deposition method, a CVD method or a spin coat method, and patterning the film by a photolithography method or the like. Then, a piezoelectric layer 120 is formed above the lower electrode 110. The piezoelectric layer 120 may be formed by the sol-gel method described above, but can also be formed by a vapor deposition method, a CVD method, or a spin coat method. Then, an upper electrode 130 is formed above the piezoelectric layer 120. The upper electrode 130 may be formed through forming a film by a vapor deposition method, a CVD method or a spin coat method, and patterning the film by a photolithography method or the like. After the upper electrode 130 has been formed, the upper electrode 130 and the piezoelectric layer 120 are patterned by a photolithography method or the like, whereby the piezoelectric element 100 is manufactured.

The piezoelectric actuator 200 in accordance with the present embodiment has the piezoelectric element 100 and the substrate 10. The piezoelectric actuator 200 can be obtained through forming the substrate 10 on which the piezoelectric element 100 described above is formed from a material that is deformable by the piezoelectric element 100. In this case, the substrate 10 can function as a vibration plate. In the piezoelectric actuator 200, the substrate 10 deforms when the piezoelectric element 100 is operated. Because the piezoelectric actuator 200 has the piezoelectric material described above in the piezoelectric element 100, its piezoelectric characteristics including the property to convert electrical energy to mechanical energy are excellent. The piezoelectric actuator 200 described above can be favorably used for liquid jet heads, and liquid jet apparatuses (ink jet printers and the like).

3. Embodiment Example and Comparison Example

Piezoelectric bodies in accordance with embodiment examples of the invention and comparison examples for comparison are described below, for describing the invention more concretely. However, it is noted that the invention is not limited to the embodiment examples to be described below.

Table 1 below summarizes compositions of the samples and their values of x and y in the compositional formula (1) used for the embodiment examples and the comparison examples. It is noted that, for reference, black dots corresponding to the embodiment examples and white dots corresponding to the comparison examples are indicated in FIG. 1.

characteristics as piezoelectric elements, and samples for evaluating structures as piezoelectrics.

The samples for evaluating piezoelectric characteristics were prepared in the following manner. First, piezoelectrics for the embodiment examples 1 through 5 and of the comparison examples 1 through 5 were each formed into a thin film on a substrate that was formed from a silicon oxide layer, a titanium oxide layer and a platinum layer deposited on a silicon substrate (Pt/TiO2/SiO2/Si). More specifically, first, a Si oxide film having a film thickness of 400 nm was formed by thermal oxidation on the surface of a Si substrate. Then, a Ti film having a film thickness of 20 nm was formed by a DC sputter method on the Si oxide film, and then was thermally treated at 650° C. for 30 minutes, thereby forming a Ti oxide film having a film thickness of 40 nm. Then, a Pt lower electrode layer having a film thickness of 150 nm was formed by a DC sputter method on the Ti oxide film.

For each of the thin films of piezoelectrics, a source material solution (in which a silicon source material is included by 1.8 mol % with respect to the entire source materials of Zr, Ti and Nb) was prepared in a manner that target compositions shown in Table 1 would be obtained for each of the samples after sintering, and formed into a thin film by a spin coat method. The thin films were formed by the following procedure. First, a source material solution of perovskite type compound, Pb (Zr, Ti, Nb)O$_3$, that was adjusted such that the concentration of the contained oxides was 0.29 (mol/L) was dripped onto the substrate described above, and the substrate was rotated at 1500 rpm to form a precursor film. Then, drying and cleaning were conducted at 300° C. for 3 minutes. The

TABLE 1

| | Lead Niobate Composition (y) | Lead Zirconate Composition | Lead Titanate Composition | (x) | XRD | Piezzo-electric Characteristics | Squareness | X scan |
|---|---|---|---|---|---|---|---|---|
| Embodiment Example 1 | 0.05 | 0.49 | 0.46 | 0.516 | A | | | |
| Embodiment Example 2 | 0.05 | 0.53 | 0.42 | 0.558 | A | | | |
| Embodiment Example 3 | 0.1 | 0.47 | 0.43 | 0.522 | A | ◯ | | ◯ |
| Embodiment Example 4 | 0.1 | 0.48 | 0.42 | 0.533 | A | | ◯ | |
| Embodiment Example 5 | 0.1 | 0.5 | 0.4 | 0.556 | A | ◯ | | ◯ |
| Embodiment Example 6 | 0.15 | 0.44 | 0.41 | 0.518 | A | | | |
| Comparison Example 1 | 0.1 | 0.4 | 0.5 | 0.444 | B | | ◯ | |
| Comparison Example 2 | 0.1 | 0.41 | 0.49 | 0.456 | B | ◯ | | ◯ |
| Comparison Example 3 | 0.1 | 0.44 | 0.46 | 0.489 | B | ◯ | ◯ | ◯ |
| Comparison Example 4 | 0.1 | 0.52 | 0.38 | 0.578 | B | | ◯ | |
| Comparison Example 5 | 0.1 | 0.53 | 0.37 | 0.589 | B | ◯ | | ◯ |
| Comparison Example 6 | 0.1 | 0.56 | 0.34 | 0.622 | B | | ◯ | |
| Comparison Example 7 | 0.1 | 0.6 | 0.3 | 0.667 | B | | ◯ | |
| Comparison Example 8 | 0.2 | 0.42 | 0.38 | 0.525 | C | | | |
| Comparison Example 9 | 0.2 | 0.47 | 0.33 | 0.588 | C | | | |

Piezoelectrics

Samples of piezoelectric bodies of the embodiment examples 1 through 5 and the comparison examples 1 through 5 prepared included samples for evaluating piezoelectric steps described above were repeated three times, and then preliminary sintering was conducted at 750° C. for 1 minutes, using a lamp anneal furnace. The foregoing steps of dripping source material solution through conducting preliminary sintering were repeated three times, and then sintering was conducted at 750° C. for 10 minutes, using a lamp anneal furnace, whereby a thin film of piezoelectrics having a film thickness of 540 nm was formed. A layer of Pt having a film thickness of 100 nm was formed as an upper electrode by a DC sputter method on the thin film of piezoelectric body. Then, the formed layers were subject to sintering at 750° C. for 10 minutes, using a lamp anneal furnace, whereby a capacitor was formed.

Samples for evaluating the structure of piezoelectrics were prepared through repeating, among the steps described above, the steps of dripping source material solution—conducting preliminary sintering six times, to form a layer having a film thickness of 1080 nm, and then sintering the layer at 750° C. for 20 minutes, using a lamp anneal furnace. The samples for evaluating the structure of piezoelectrics were not provided with upper electrodes.

Evaluation of Crystal Structure

Evaluation of the crystal structure of each embodiment example and each comparison example was conducted by XRD (X-ray diffraction) measurement, whereby the crystal orientation and the presence/absence of heterogeneous phase were examined.

Figure 4:
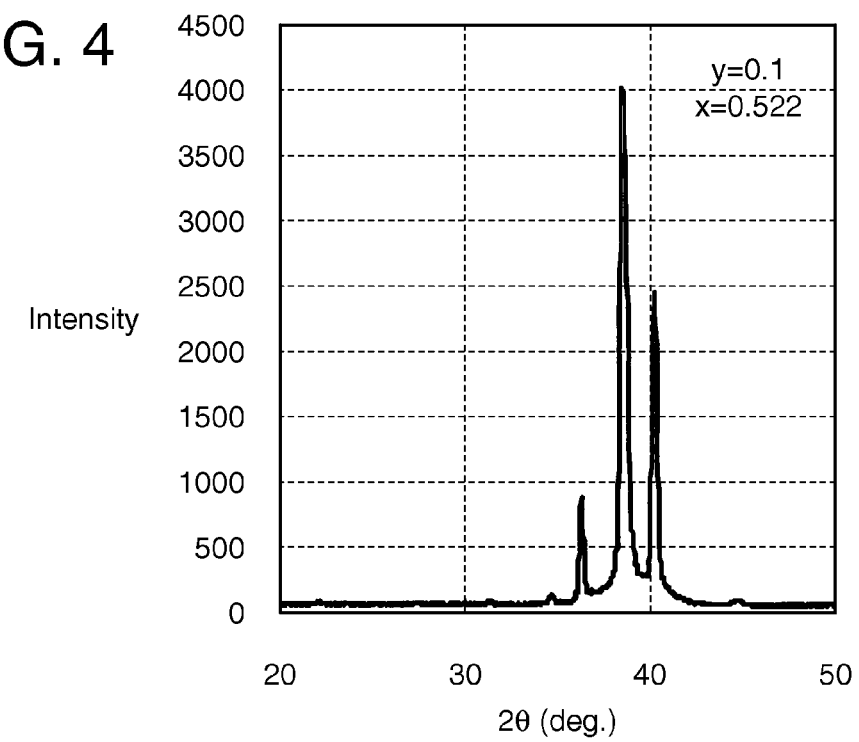
FIG. 4 shows an example of a XRD chart of a piezoelectric body in accordance with an embodiment example.

The results are shown in Table 1. In Table 1, A in the column of XRD indicates that highly oriented (111) crystal orientation was present in the normal direction of the substrate surface, B indicates that insufficient (111) crystal orientation was present in the normal direction of the substrate surface, and C indicates that the pyrochroa structure was generated. The piezoelectric bodies of the embodiment examples 1 through 5 are all highly oriented in a (111) crystal orientation toward the normal direction of the substrate surface, and do not have the pyrochroa structure. FIG. 4 shows a XRD chart of the piezoelectric body of the embodiment example 3, as a representative of the embodiment examples. It is clear from FIG. 4 that a large diffraction peak of a (111) plane of the perovskite structure crystal is observed at 2θ near 38.5°, but a diffraction peak of a (001) plane that may appear at 2θ near 22° and a diffraction peak of a (101) plane that may appear at 2θ near 32° are not observed. Similar results were obtained in the other embodiment examples. Therefore, it was found that the piezoelectrics of the embodiment examples 1 through 5 each had a perovskite structure and was highly oriented in a (111) orientation with respect to the normal line of the substrate surface.

Figure 5:
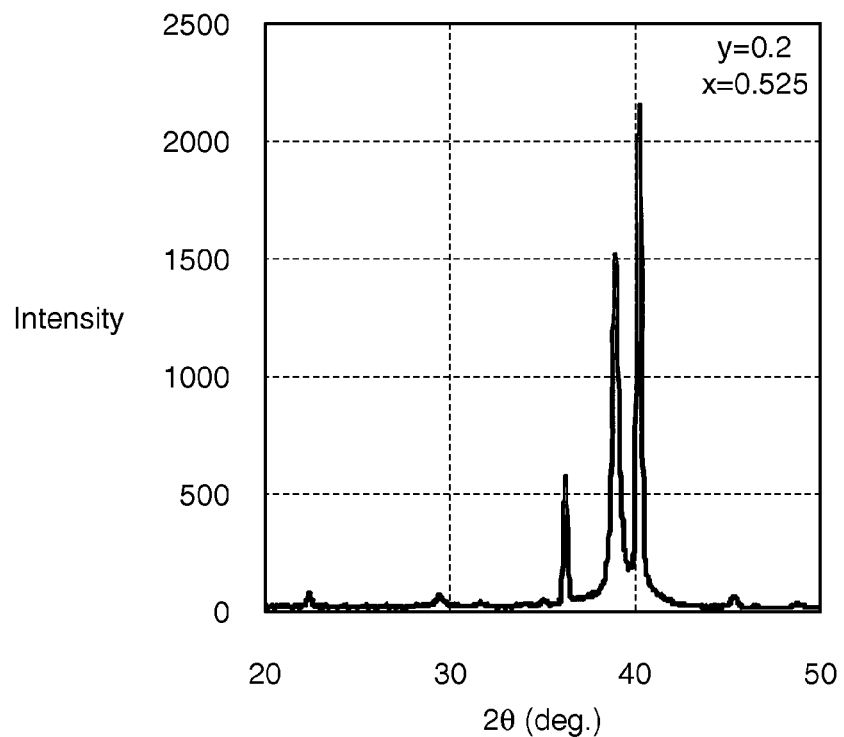
FIG. 5 shows an example of a XRD chart of a piezoelectric body in accordance with a comparison example.

On the other hand, FIG. 5 shows a XRD chart of the piezoelectric body of the comparison example 8, as a representative of the comparison examples. It is clear from FIG. 5 that a diffraction peak of a (111) plane of the perovskite structure crystal is observed at 2θ near 38.5°. However, compared to the corresponding peak of the embodiment example, it is observed that the intensity is substantially smaller (which can be compared, using the absolute values of the intensity, or the intensity of the diffraction peak of the (111) plane of platinum (lower electrode) at 2θ near 40° as a standard). Therefore, it is understood that, in the comparison example 8, crystals having the perovskite structure reduced, and the pyrochroa structure was formed. The same result was also obtained in the comparison example 9. Moreover, in the chart of FIG. 5, a diffraction peak of a (001) plane at 2θ near 22° and a diffraction peak of a (101) plane at 2θ near 32° are clearly observed. Similar results were obtained in all the other comparison examples. Accordingly, it was found that, in the piezoelectrics of the comparison examples 1 through 9, the perovskite structure was not sufficiently formed, or sufficient (111) orientation was not formed with respect to the normal line of the substrate surface.

It is understood from the results obtained that the pyrochroa structure would be generated and sufficient piezoelectric characteristics would not be achieved unless the range of y in the compositional formula (1) is at least less than 0.2.

Evaluation of Piezoelectric Characteristics

Evaluation of the piezoelectric characteristics of each embodiment example and each comparison example was conducted by a common piezometer thereby measuring piezoelectric constants $d_{33}$. Samples used in this evaluation are piezoelectrics listed in Table 1 which are checked with ○ marks in the column of piezoelectric characteristics. This evaluation was conducted for samples with y fixed at y=0.1 and with different values of x.

Figure 6:
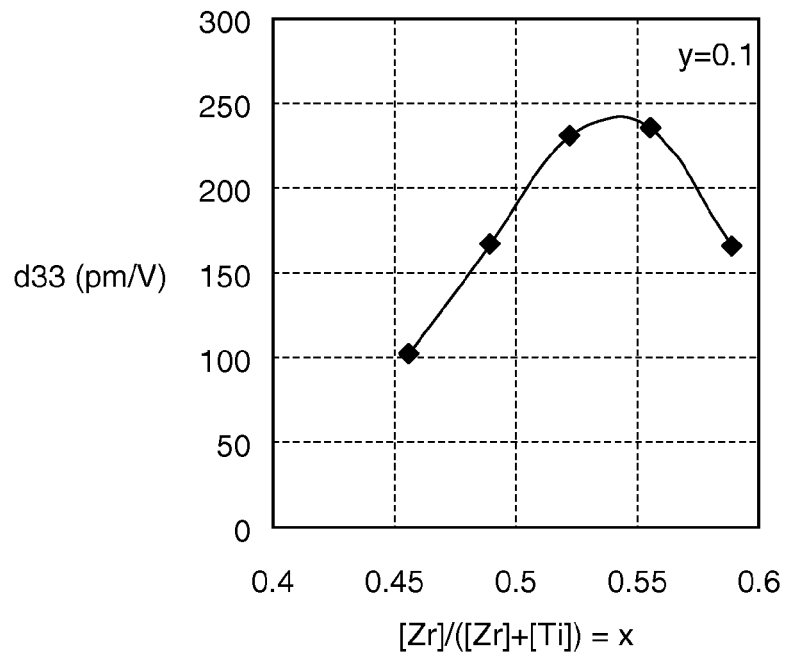
FIG. 6 is a graph plotting measurement results of piezoelectric constants.

FIG. 6 is a graph that plots the results of measurement of the samples, where the value of x is plotted along the axis of abscissas and the values of $d_{33}$ (pm/V) is plotted along the axis of ordinates. FIG. 6 shows that a curve connecting plotted points of the samples reaches the maximum piezoelectric constant $d_{33}$ in proximity of x=0.54. It was found that the piezoelectric constant $d_{33}$ became smaller than 200 pm/V when x was smaller than about 0.51, and similarly became smaller than 200 pm/V when x was greater than about 0.57. When the value x is outside the range of $0.51 \leq x \leq 0.57$, the piezoelectric constant $d_{33}$ rapidly becomes smaller, and therefore it is found that the value x needs to be within the range specified above in order for the piezoelectric body to have a very high piezoelectric constant.

Evaluation of MPB

Figure 7:
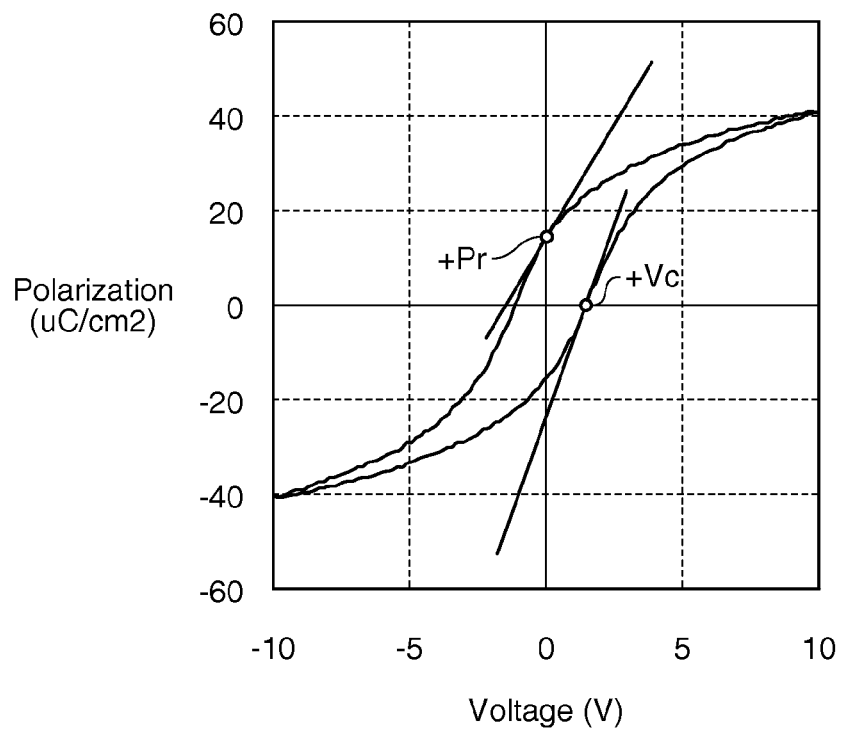
FIG. 7 is a graph showing an example of hysteresis loop curves of a piezoelectric body.

P-V hysteresis evaluation was conducted in several composition ranges, assuming that P-V hysteresis characteristics would have different tendencies between the case of tetragonal crystals and the case of rhombohedral crystals in perovskite structure crystals if they are similarly highly oriented in (111) orientation. FIG. 7 shows an example of hysteresis loop curves of piezoelectric body (where the polarizability is plotted along the axis of ordinates and the applied voltage is plotted along the axis of abscissas). In this evaluation, the squareness ratio of the hysteresis curve is defined by a value [S (+Vc)/S (+Pr)] that is obtained by dividing the slope of hysteresis curve S (+Vc) at a point +Vc in the hysteresis curve by the slope of hysteresis curve S (+Pr) at a point +Pr in the hysteresis curve. +Vc is a point where the applied voltage is positive, and the polarizability is zero, and +Pr is a point where the applied voltage is zero, and the polarizability is positive. Samples used for this evaluation are piezoelectrics listed in Table 1 which are checked with ○ marks in the column of squareness. The evaluation was conducted for samples with y fixed at y=0.1 and with different values of x.

Figure 8:
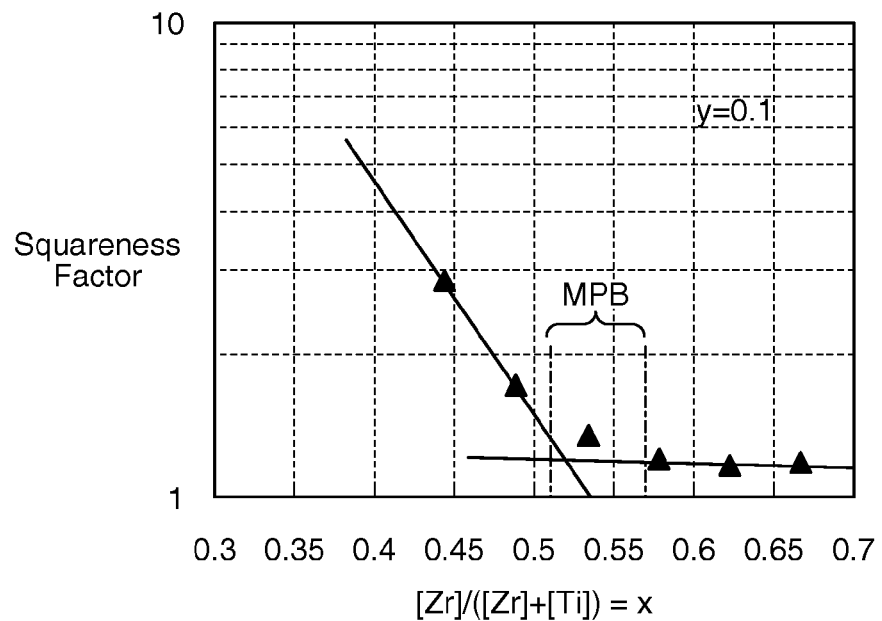
FIG. 8 is a graph plotting measurement results of squareness.

FIG. 8 is a graph showing plotted results of measurement of the samples where the value of x is plotted along the axis of abscissas and the squareness is plotted along the axis of ordinates. Changes in the squareness of the hysteresis curve with respect to values of x depend, in a perovskite structure, on the crystal system to which the perovskite structure belongs. Therefore, it is believed that the tetragonal crystal system and the rhombohedral crystal system have different change rates of squareness with respect to values of x. In this respect, as shown in FIG. 8, plots in regions that belong to the respective crystal systems are approximated by two linear lines. It is assumed that a region near the intersection of the two linear lines may be the so-called morphotropic phase boundary (MPB) that cannot be classified in either of the crystal systems. It can be observed from FIG. 8 that the MPB in the composition with y=0.1 is present in proximity of the value of x being 0.51 to 0.57. On the other hand, it is known that the MPB composition with y=0 is present in proximity of the value of x being 0.53. Therefore it was found, according to the result of the evaluation, that, when niobate (Nb) is doped in PZT, the range of values x in the MPB composition tends to widen without a substantial shift of its center value.

It is found that the MPB composition in the composition with y=0.1 assumed from the evaluation is present in proximity of the value x being 0.51 to 0.57. It is also found that this result supports the result of evaluation of piezoelectric characteristics described above where the value of piezoelectric characteristic $d_{33}$ in the MPB composition becomes very large.

Evaluation by x Scan

It is understood from the evaluation of crystal structure described above that the piezoelectric body of each of the embodiment examples is highly oriented in the (111) orientation, as shown in FIG. 4. Then, the crystallinity was evaluated in greater detail by conducting x scan for the diffraction peak corresponding to a (111) plane at 2θ being about 39°. Samples used for the evaluation are piezoelectrics listed in Table 1 which are checked with ○ marks in the column of x scan. The evaluation was conducted for samples with y fixed at y=0.1 and with different values of x.

Figure 9:
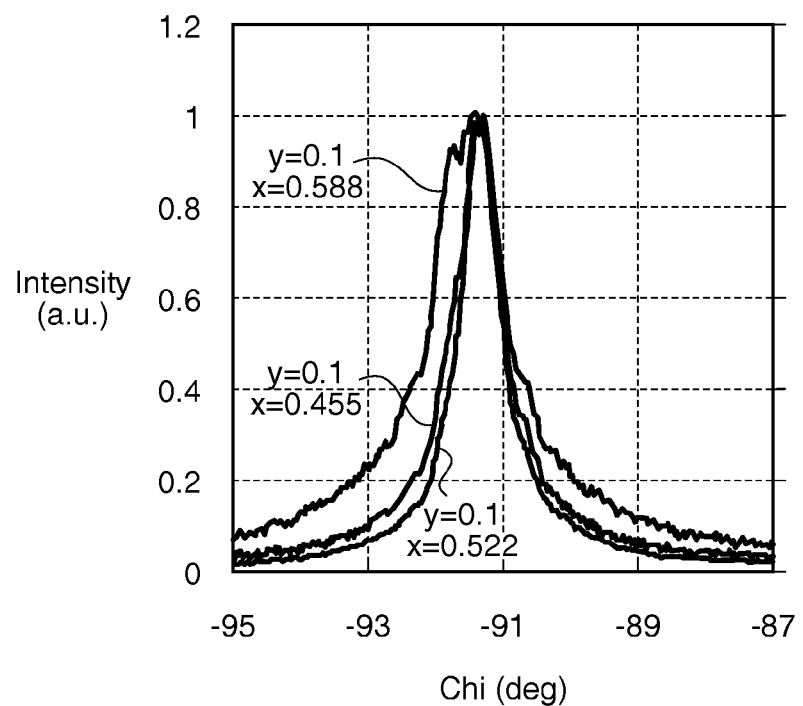
FIG. 9 is a graph of an example of results obtained by x scan.

FIG. 9 is a graph showing a part of the results obtained by x scan, where the intensity is plotted along the axis of ordinates, and x (the rotation angle of the samples) is plotted along the axis of abscissas. The values of x and y corresponding to each of the curves are noted in the graph. The results of x scan appear to indicate that, the smaller the half width of the obtained curve, the better the crystallinity.

Figure 10:
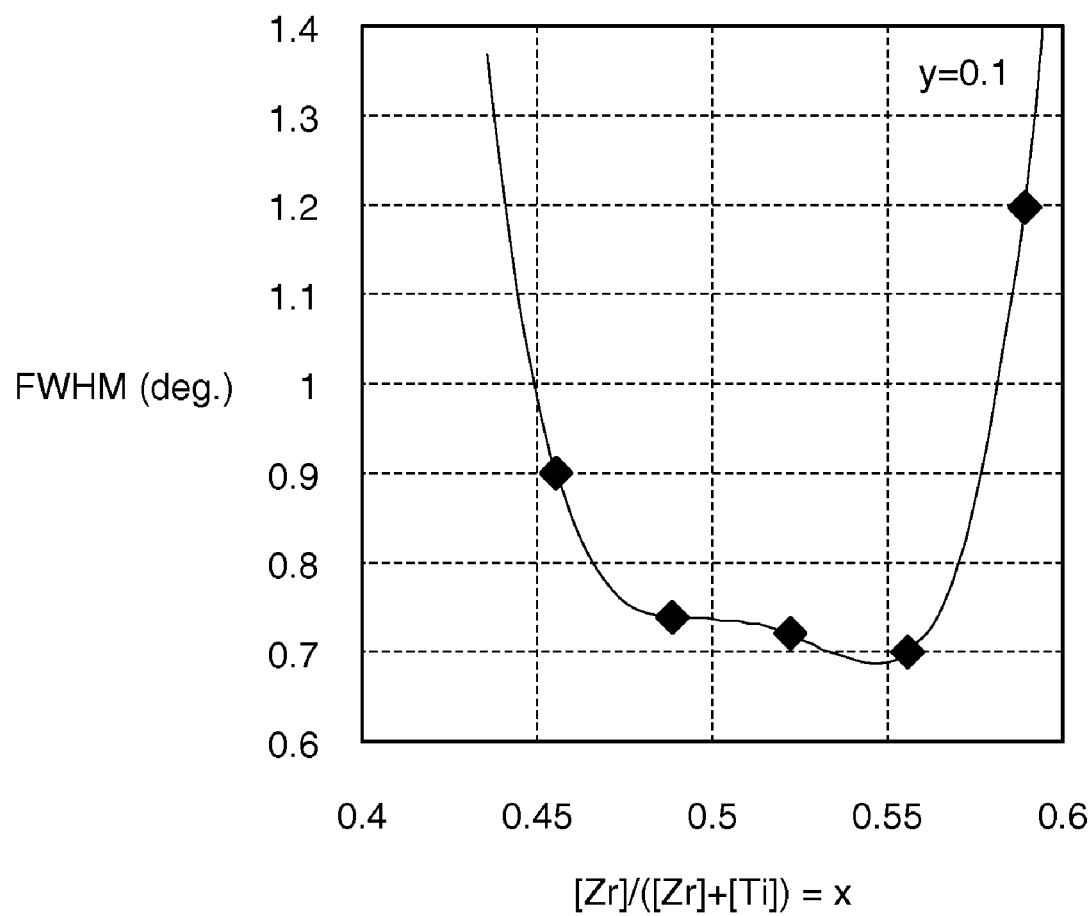
FIG. 10 is a graph plotting measurement results of half-width values in x scan.

FIG. 10 is a graph plotting the half width (full width at half maximum: FWHM) in x scan of each of the samples in the present evaluation along the axis of ordinates, and the value of x along the axis of abscissas. It is observed from FIG. 10 that the half width has the minimum values in a range of x being 0.53 to 0.57. Smaller values of the half width in x scan mean that piezoelectric bodies having better crystallinity are obtained. Accordingly, it is found that the crystallinity is excellent at values of x at which the piezoelectric constant $d_{33}$ becomes maximum.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A piezoelectric body comprising:
   a perovskite type compound that is expressed by a compositional formula being Pb $(Zr_x Ti_{1-x})_{1-y} M_y O_3$, where M is at least one of Ta and Nb, x is in a range of $0.51 \leq x \leq 0.57$, and y is in a range of $0.05 \leq y < 0.2$,
   wherein the perovskite type compound contains at least one of $SiO_2$ and $GeO_2$ as an additive, and the additive is added in an amount of 0.5 mol % or higher but 5 mol % or lower with respect to the amount of perovskite type compound.

2. A piezoelectric element comprising the piezoelectric body recited in claim 1.

3. A piezoelectric actuator comprising the piezoelectric element recited in claim 2.

* * * * *